(12) United States Patent
Melzner (10) Patent No.: US 8,694,930 B2
(45) Date of Patent: Apr. 8, 2014

(54) METHOD AND APPARATUS FOR PROVIDING A LAYOUT DEFINING A STRUCTURE TO BE PATTERNED ONTO A SUBSTRATE

(75) Inventor: Hanno Melzner, Sauerlach (DE)

(73) Assignee: Infineon Technologies AG, Neubiberg (DE)

( * ) Notice: Subject to any disclaimer, the term of this patent is extended or adjusted under 35 U.S.C. 154(b) by 155 days.

(21) Appl. No.: 13/208,237

(22) Filed: Aug. 11, 2011

(65) Prior Publication Data

US 2013/0037915 A1 Feb. 14, 2013

(51) Int. Cl.
*G06F 17/50* (2006.01)

(52) U.S. Cl.
USPC .......................................................... 716/55

(58) Field of Classification Search
USPC .......................................................... 716/55
See application file for complete search history.

(56) References Cited

U.S. PATENT DOCUMENTS

| 6,412,095 B1* | 6/2002 | Tada ............................ 716/122 |
| 6,523,160 B2* | 2/2003 | Kondou ........................ 716/131 |
| 7,704,645 B2* | 4/2010 | Mitsui ............................. 430/5 |
| 7,716,021 B2* | 5/2010 | Kameyama et al. ............. 703/2 |
| 2005/0204322 A1* | 9/2005 | Kotani et al. .................. 716/10 |
| 2006/0190913 A1* | 8/2006 | Melvin et al. .................. 716/19 |
| 2009/0300561 A1 | 12/2009 | Tong et al. | |
| 2010/0199255 A1 | 8/2010 | Jung et al. | |

FOREIGN PATENT DOCUMENTS

WO   WO 2011/051791   5/2011

* cited by examiner

*Primary Examiner* — Jack Chiang
*Assistant Examiner* — Brandon Bowers
(74) *Attorney, Agent, or Firm* — Slater & Matsil, L.L.P.

(57) ABSTRACT

A method provides a layout defining a structure to be patterned onto a substrate. The structure is registered with a predefined grid of the layout. The method includes locally stretching the grid in a first portion of a layout causing a problematic spot on the substrate.

19 Claims, 7 Drawing Sheets

METHOD AND APPARATUS FOR PROVIDING A LAYOUT DEFINING A STRUCTURE TO BE PATTERNED ONTO A SUBSTRATE

TECHNICAL FIELD

Embodiments of the present invention relate to semiconductor processes and devices and particular embodiments relate to a method and apparatus for providing a layout defining a structure to be patterned onto a substrate.

BACKGROUND

A semiconductor layout is created manually or automatically using layout software. The layout data are pre-processed and written on a mask. For example, the mask incorporates a chrome layer on glass where the chrome is patterned according to the layout data. The mask is usually repeatedly used to pattern chips located on a substrate, for example, a silicon wafer, with a photographic process called lithography.

Typically, this patterning includes the following steps:
Photographically transfer the pattern into a light-sensitive photoresist and develop the photoresist such that a physical resist pattern is created on the substrate.
Transfer the photoresist pattern into the layers on the substrate by etching or ion implantation.
Remove the photoresist.
Typically, this process is repeated several times for respective layers of the layout (such as metal conductors, contact holes).

SUMMARY OF THE INVENTION

An embodiment of the invention provides a method for providing a layout defining a structure to be patterned onto a substrate, wherein the structure is registered with a predefined grid of the layout. The method comprises the step of locally stretching the grid in a first portion of the layout causing a problematic spot on the substrate.

Another embodiment of the invention provides a method for providing a layout defining a structure to be patterned onto a substrate, wherein the structure is registered with a predefined grid. The method comprises determining a size and a shape of a first portion of a layout around a location of the layout causing a problematic spot dependent on a shape and a size of a determined hotspot indicating a hotspot. A second portion of the layout enclosing the first portion of the layout is determined. A stretching-factor S for the first portion of the layout is determined based on a deviation of a dimension of the structure at the hotspot from a minimum acceptable dimension of the structure. A size of the second portion of the layout is defined based on the size of the first portion of the layout or a maximum acceptable compression of the grid of the layout. The grid in the first portion of the layout is locally stretched in accordance with the stretching-factor S and the grid in the second portion of the layout is locally compressed.

A further embodiment of the invention provides a method for manufacturing a chip. The method comprises providing a layout defining a structure on a substrate. The structure is registered with a predefined grid of the layout. The grid is locally stretched in a first portion of the layout causing a problematic spot on the substrate. The substrate is patterned in accordance with the layout.

Another embodiment provides an apparatus for providing a layout defining a structure to be patterned onto a substrate, wherein the structure is registered with a predefined grid of the layout. The apparatus comprises a modificator which is configured to stretch the grid locally in a first portion of the layout causing a problematic spot on the substrate.

Another embodiment provides a chip which comprises a substrate, a patterned region on the substrate averagely registered with a predefined grid. The patterned region comprises a first portion of a layout in which the grid is stretched when compared to the predefined grid and a second portion of the layout in which the grid is compressed when compared to the predefined grid so that a transition from the stretched grid to the predefined grid is generated.

BRIEF DESCRIPTION OF THE DRAWINGS

Embodiments according to the present invention will subsequently be discussed making reference to the figures in which.

DETAILED DESCRIPTION OF ILLUSTRATIVE EMBODIMENTS

A layout, e.g., for a semiconductor chip, defines a structure to be patterned onto a substrate, e.g., a wafer. The structure as realized on the substrate (final patterns) is not a true scaled image of the drawn layout. Instead, it will deviate more or less from what the drawn layout dictates (apart from scale), through effects such as image distortions in mask fabrication, misalignments between two or more layers and distortions in the pattern transfer step. A further effect is a distortion in the photographic process, in particular, as there is a growing ratio between wavelength and pattern dimension that limits the fidelity of the photographic process. For example, a wavelength of 193 nm is used to photographically produce structures with dimensions of 100 nm or less. If distortions are above some acceptable level they create shorts, opens or other unwanted configurations on the chip that make the chip either unusable (yield issue) or pose a risk that the chip fails during the expected lifetime (reliability issue). A region in the layout that is likely to end up as such a "problematic spot" on the chip is called "hotspot".

In order to assure that the layout is free of hotspots the layout is analyzed by a simulation that foresees expected deviations between drawn layout and final patterns, mainly but not exclusively those created from the lithography step. The simulated patterns are analyzed for problematic risky configurations called hotspots. A risk of a hotspot exits if spaces are more narrow than some prescribed limit (e.g., "bridge type" hotspot, risk of shorts) or if lines are more narrow than some prescribed limit (e.g., "pinch type" hotspot, risk of opens). Even configurations that do not appear as shorts or opens in the simulations but appear as abnormally narrow spaces or lines are considered as a manufacturing risk (hotspot). That is because the simulation model does not incorporate all sources of distortion, does not describe even those source that are included with perfect accuracy, and manufacturing conditions may occasionally deviate more from the norm than assumed in the simulation model parameters. It is therefore necessary to have a "hotspot criterion" like a non-zero minimum allowable space or width of the simulated structures in order to identify hotspots. For example, if the minimum allowable drawn dimension is 100 nm, a hotspot may be indicated by a width of simulated structures less than 80 nm. That is, the hotspot criterion for "pinch type" hotspots is 80 nm. Further, another hotspot may be indicated by a space between simulated structures less than 70 nm, that is, the hotspot criterion for "bridge type" hotspots is 70 nm.

A current method for avoiding a hotspot is using layout restrictions. If hotspots arise from use of some pre-fabricated circuit module such as a logic standard cell (e.g., inverter, NAND, flipflop) it is common practice to restrict usage of that module. For instance, usage of the problematic module may be forbidden. Or, the way it can be connected to other circuit modules can be restricted by adding so-called "pin blockages" if the problem arises from interaction of shapes inside the module with those that connect to the module. However, such restrictions may end up in additional chip area consumption. Also, not all but only a special kind of hotspots can be attacked by this method. A further method is rip-out-and-rerouting. Here, conductor shapes at the hotspot and in the neighborhood are removed and an attempt can be made to create a modified layout that has no hotspot. This may be done manually or automatically, however, it will be labor-intensive if done manually, will end up in a substantial modification of large regions on the chip with unexpected impact on timing if done automatically, and does not necessarily remove the hotspot because the new layout may not be any better than the old one.

Furthermore, wiring in upper and lower layers may be changed so that the verification of success is complex. The rip-out-and-reroute is mainly used for logical circuits. An alternative method is guided repair. Here, edges of shapes around the hotspot are moved by small distances (smaller or in the order of the minimum allowable dimension of the layout). For instance, in case of a pinching hotspot edges are moved such that the line width is locally increased. This method, however, does not work easily in a dense environment because moving an edge may create new issues at the opposite side of the edge ("cascading"). Therefore, moving an edge such that line width increases will usually decrease the width of adjacent spaces to neighbor shapes which may end up as a bridge hotspot. Iterative execution of this recipe is thus necessary. Reliable algorithms to perform such repeated edge movements are difficult to design. It is not guaranteed that a satisfactory final result can be achieved.

The need is to provide a method and an apparatus for modifying the drawn layout such that hotspots identified in the simulation are removed or repaired and the layout after doing these modifications is free of hotspots, and can thus safely be manufactured without risk of shorts and opens (problematic spots).

Figure 1A:
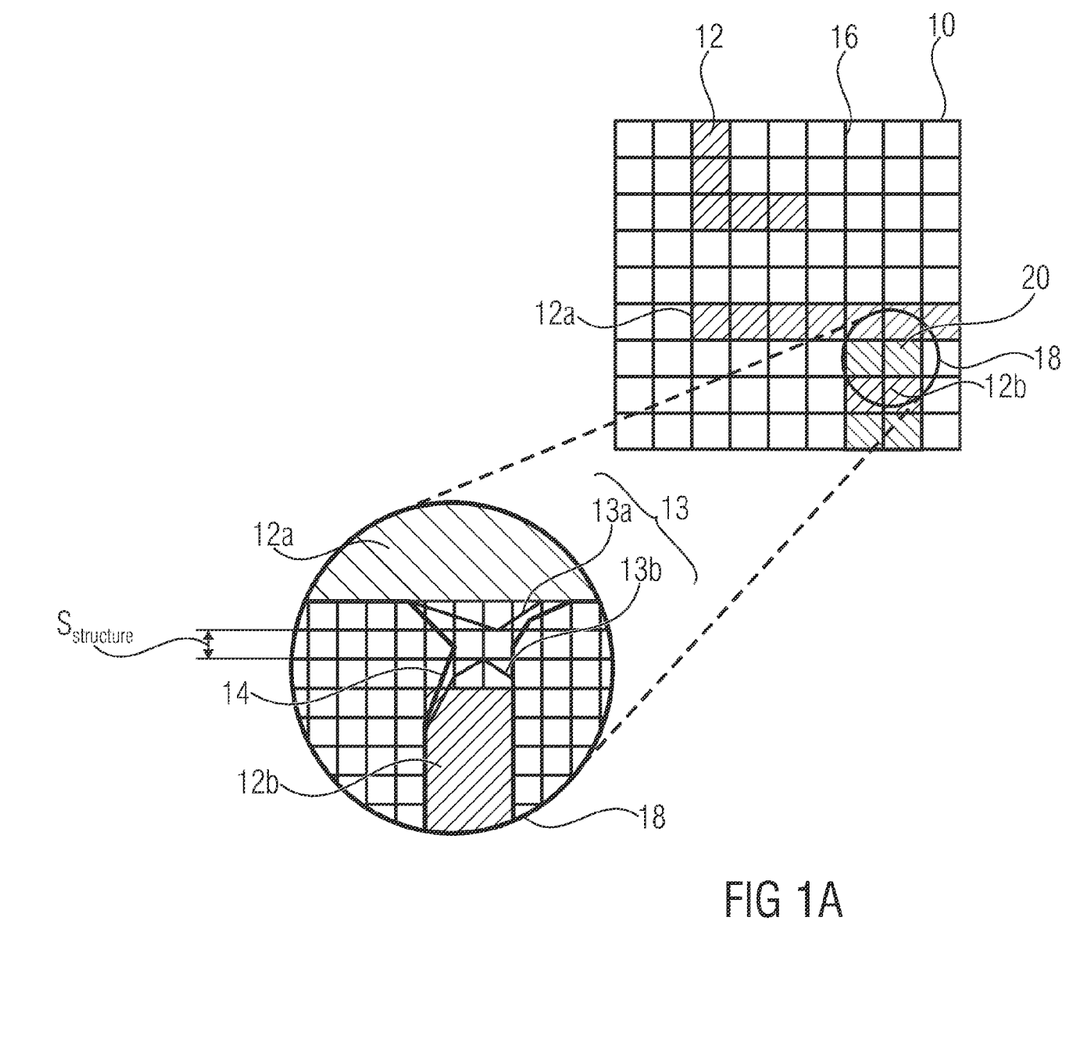
FIGS. 1a-1b show a schematic representation of a method for providing a layout according to an embodiment.
Figure 1B:
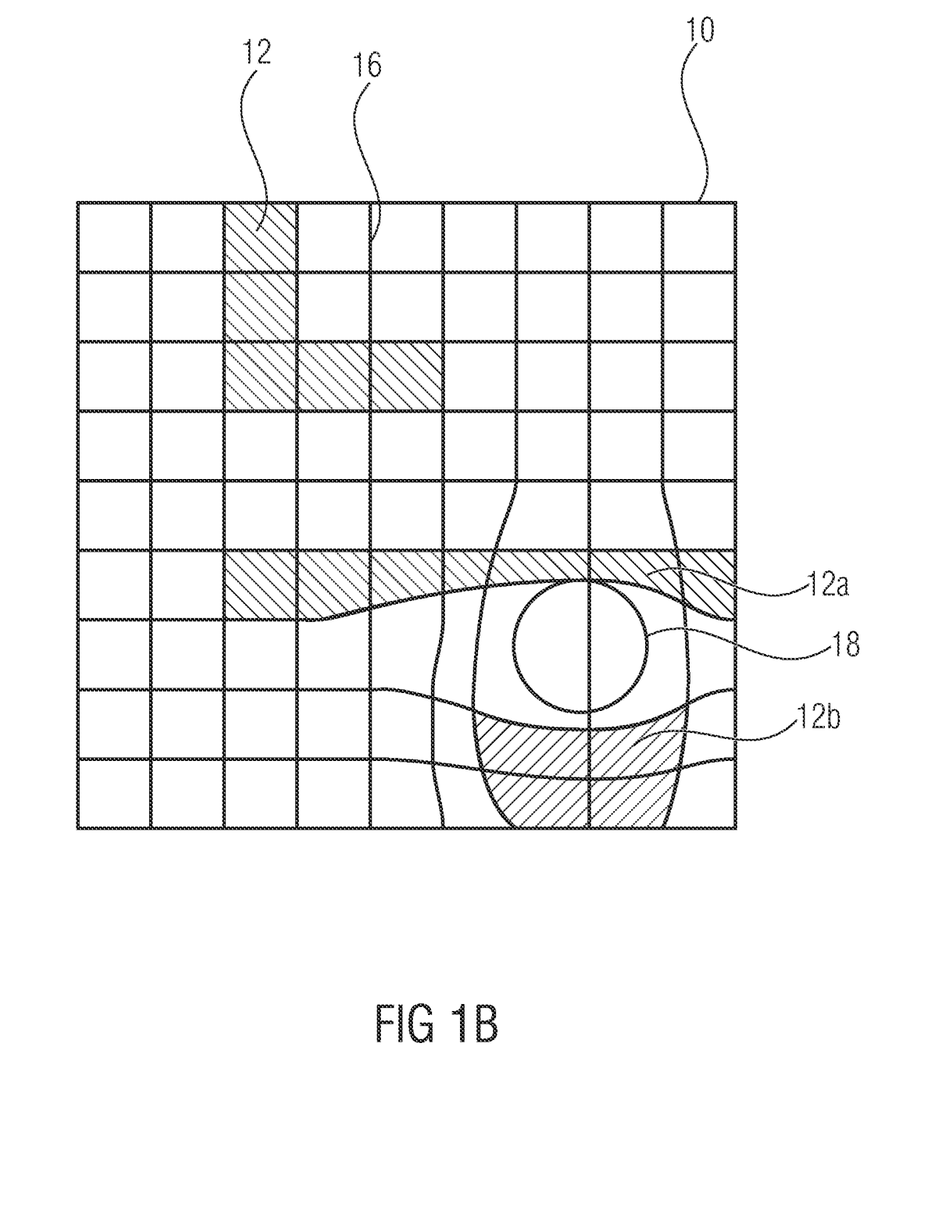

FIG. 1a and FIG. 1b illustrate an improved approach for a method for providing a layout 10 defining a structure 12 to be patterned onto a substrate. FIG. 1a shows the layout 10 and the structure 12 before performing the method, while FIG. 1b shows the layout 10 defining the structure 12 after performing the method.

FIG. 1a illustrates an initial state where the layout 10 defines the structure 12 so as to be registered to a predefined grid 16 of the layout 10. In the layout 10 two drawn shapes 12a and 12b of the structure 12 are close to each other so that a physical problem, e.g., a short or open or other unwanted configuration in the circuit, between final shapes 14 may be caused when patterned onto a substrate. A so-called problematic spot may have negative impacts on functionality or reliability of the product.

In the following the cause of the problematic spot as well as the detection method will be discussed. The problematic spot in a portion 18 of the layout 10 may be detected by looking at simulated shapes 13. In other words, the simulation result shows a hotspot 20 indicating a risk of a short in final shapes 14 or at least a distance ($S_{structure}$) between two simulated shapes 13a and 13b less than some allowed minimum dimension in a portion 18 of the layout 10. The allowed minimum dimension, also referred to as hotspot criterion ($S_{hotspot\text{-}criterion}$), is a threshold value which may be defined by a lithography process and may, in turn, depend on a wavelength used for the lithography process. It should be noted, that the final shapes 14 differ from the simulated shapes 13a and 13b because simulation does not take all effects into account and/or simplifies the effects and/or underestimates manufacturing variations. So the final shapes 14 may look even worse compared to the simulated shapes 13 if process conditions are on the bad side. In order to compensate this difference some safety margin may be used for the simulation. In general, if the spacing or a width ($S_{structure}$) of the simulated shapes 13a and 13b gets smaller than a minimum dimension ($S_{hotspot\text{-}criterion}$) which is acceptable to be patterned onto the substrate the drawn shapes 12a and 12b of the structure 12 are modified in order to remove the hotspot 20 in the simulated shapes 13a and 13b and thus to avoid the problematic spot (risk of the physical problem) in the final shapes 14.

In order to modify the structure 12, the regular grid 16 is locally stretched in the first portion 18 of the layout 10 as is illustrated in FIG. 1b. The local stretching results in an enlarged spacing between the parts 12a and 12b of the structure 12 which are now registered with the stretched grid such that the hotspot 20 in the first portion 18 of the layout 10 is avoided. As a consequence of this, the layout 10 does not result in the problematic spot of the final shapes 14 when the structure 12 is patterned onto the substrate. Therefore, the method for providing the layout 10 includes a step of locally stretching the grid 16 with which the structure 12 is registered in the first portion 18 of the layout 10. Thus, embodiments of the invention provide a simple and advantageous algorithm for layout modification in order to ensure manufacturability.

An advantage of the described method is that the stretching of the grid 16 and thus the deformation of the structure 12 is small so that there is no impact on the timing of the circuit or on other electrical parameters of the circuit. Accordingly, the method may be used for all kinds of circuits and is not limited to any kind of circuit, like a logical circuit. Moreover, different types of hotspots are avoidable, such as a short-circuiting-hotspot and an open-circuiting-hotspot. A further advantage of the above embodiment is that the stretching is performed locally so that a fast and simple local simulation for detecting whether the layout modification was successful or not (i.e., does not change the electrical characteristics of the circuit defined by the structure 12 and resolves the hotspot conditions) may be used.

Referring to FIG. 2a-2d, two embodiments of registering an edge of the structure of the layout to the grid will be discussed.

Figure 2A:
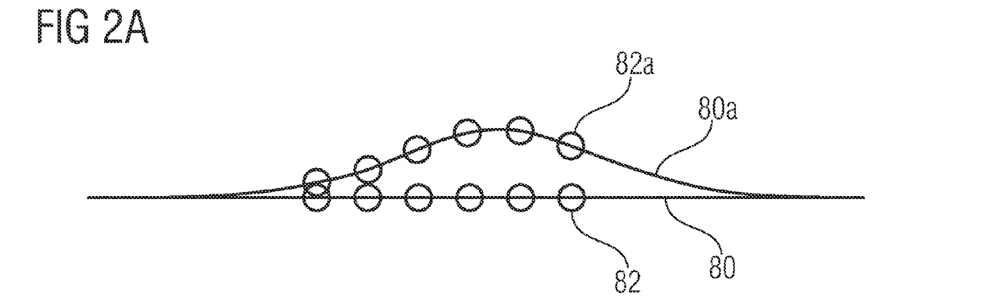
FIGS. 2a-2d schematically show an edge of a structure of a layout registered to an original grid line and two variants of the edge registered to a distorted grid line with and without fracturing according to embodiments.

FIG. 2a shows an original grid line 80 of the grid with six grid points 82 periodically aligned thereon. The six grid points 82 are arranged on a center portion of the grid line 80 such that the first and the last of the six grid points 82 have a different distance to a center of the center portion. A grid line 80a with its six grid points 82a corresponds to the grid line 80 with the grid points 82, but, in contrast, is distorted and shifted, e.g., by stretching the grid. Thus, the shifted grid line 80a is curved so that a center portion of the grid line 80a is shifted compared to the grid line 80, but both end portions of the grid line 80a are not dislocated. The distortion of the grid line 80a is symmetrical so that its center is maximally dislocated. The six grid points 82a are consequently shifted such that the first and the last of the six grid points 82a are differently dislocated due to its position in relation to the center of the grid line 80a.

Figure 2B:
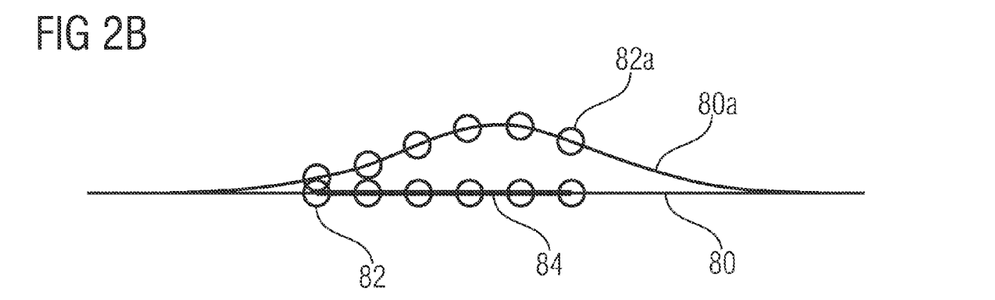

FIG. 2b shows the two grid lines 80 and 80a with the grid points 82 and 82a and an edge 84 of the structure. The straight edge 84 is registered to the grid points 82 and thus to the original grid line 80.

Figure 2C:
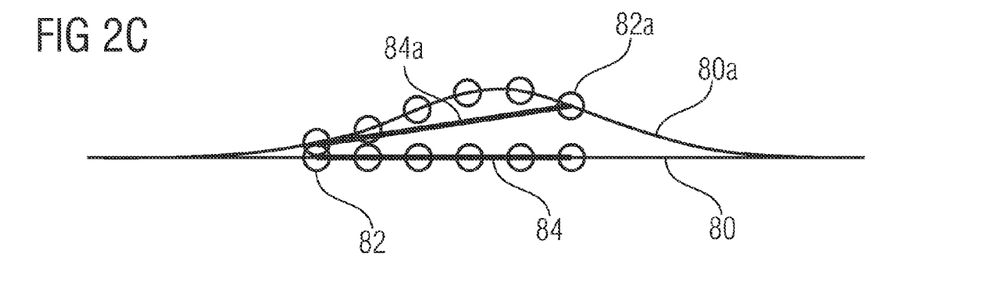

FIG. 2c equates FIG. 2b, but further shows a non-fractured shifted edge 84a. The edge 84a corresponds to the edge 84 and is shifted according to the grid line 80a. The edge 84a illustrates a non-fractured edge which is straight so that only the corners of the 84a edge registered to the first and last grid point 82a are shifted and the line in between is kept straight. Due to the different distances of the first and last of the six grid points 82a from the center of the grid line 80a the edge 84a is angled compared to the edge 84. This embodiment of layout modifications is predestinated for layouts comprising mainly short straight edges.

Figure 2D:
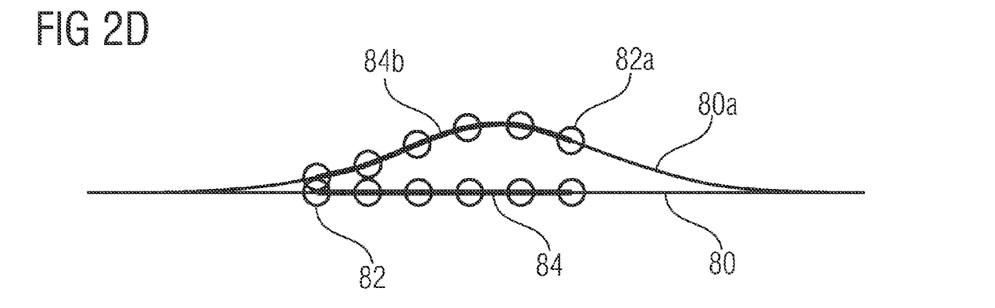

FIG. 2d corresponds to FIG. 2b, but shows a fractured edge 84b which is registered to the grid line 80a. Due to the fracturing, the edge 84b is approximately curved according to the grid points 82a. Therefore, the corners and the polygon-like edge 84b of the structure are shifted so that the shape of the edge 84b substantially equates to the shape of the grid line 80a. This embodiment is typically used for layouts comprising long straight edges.

Figure 3:
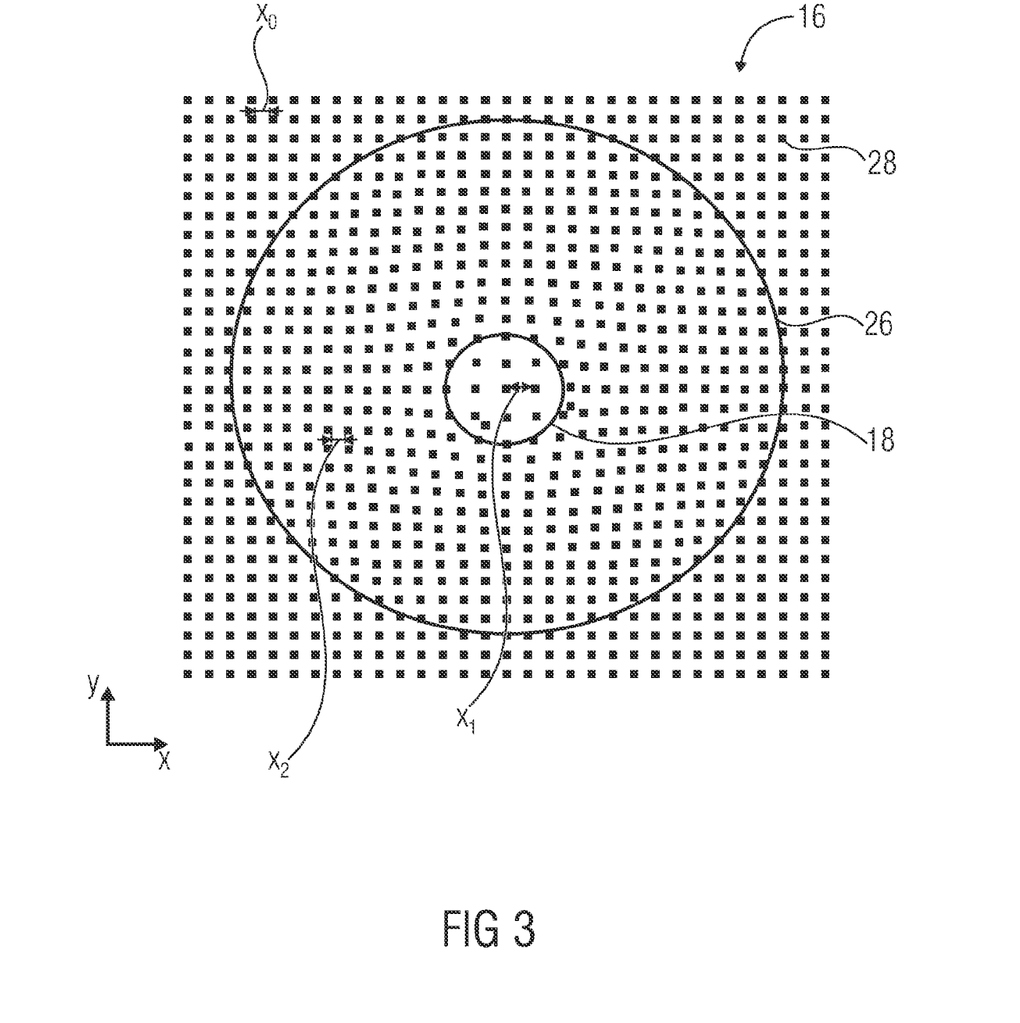
FIG. 3 shows a schematic representation of a stretched and compressed grid according to an embodiment.

FIG. 3 exemplarily shows the rectangular grid 16 which has been locally stretched in the first portion 18 of the layout 10. In accordance with a further embodiment, locally stretching the grid 16 is done by applying a stretching-factor S to the first portion 18 of the layout 10. The stretching-factor S, also referred to as the grid bloat factor, may be determined on the basis of a deviation of the spacing or the width ($S_{structure}$) of the simulated structure at the hotspot 20 (before the local stretching) from the minimum acceptable dimension ($S_{hotspot-criterion}$), also referred to as hotspot criterion. The stretching-factor S may be determined as follows:

$$S = \frac{S_{hotspot-criterion}}{S_{structure}}, \quad (1)$$

$$(S_{structure} > 0)$$

In case of $S_{structure}=0$, i.e. short type hotspot, the formula (1) leads to a mistake, so the stretching-factor S may be estimated at 1.1 or at a range of 1.05 and 1.25.

Applying the stretching-factor S results in a local change of a lattice parameter $x_1$ of the grid 16 within the first portion 18. The lattice parameter $x_1$, i.e., a pitch between unity cells of the regular grid after the local stretching, is enlarged in accordance with the stretching-factor S compared to the lattice parameter $x_0$ of the predefined (unstretched) grid 16. Note that the local stretching is shown in FIG. 3 in an exaggerated manner in order to illustrate the stretching effect more clearly. In reality, the stretching-factor S for the first portion 18 is, for example, around 1.1 or in the range of 1.05 to 1.25.

A geometry of the first portion 18 may be set dependent on a shape and a size of the hotspot 20 (not shown), i.e., the shape and the size of the area in which the simulated structure fulfills the hotspot criterion, and/or dependent on a position of a further hotspot adjacent to the hotspot 20. The size and the shape of the first portion 18 are set such that the hotspot 20 is enclosed by the first portion 18 or such that a plurality of hotspots is commonly enclosed by the first portion 18 if the layout 10 has at least two adjacent hotspots. If, for example, the hotspot 20 is of substantial square shape the geometry is a circle or rounded square, and if the hotspot is of substantial elongated shape the geometry is an ellipse. The ellipse may have its main axis parallel to a grid axis of the grid 16 or may be chosen to be parallel to a direction of maximum extension of the hotspot 20.

Furthermore, FIG. 3 shows that the first portion 18, also referred to as the inner region, is surrounded by a second portion 26 which, in turn, is surrounded by a third portion 28. In accordance with another embodiment, the grid 16 in the second portion 26 is compressed such that a transition from the stretched grid within the first portion 18 to the predefined grid 16 in the third portion 28 is generated. Thus, the grid 16 is locally compressed in the second portion 26 of the layout 10 in order to compensate for the shifting or expansion in the first portion 18. As a consequence, a lattice parameter $x_2$ in the second portion 26 is smaller than the lattice parameter $x_o$ of the predefined grid 16 in the third portion 28 and smaller than a lattice parameter of the grid in the second portion 26 before performing the method.

The compression of the grid 16 in the second portion 26, also referred to as the outer transition region, is adjustable by varying a size of a geometry of the second portion 26, also referred to as the relaxation radius. The size of the second portion 26 is set such that a grid deformation can be made arbitrarily small and thus a creation of a new hotspot is avoided. Thus, the size of the second portion 26 depends on the size of the first portion 18, on the stretching-factor and on a maximum acceptable grid deformation in the second portion 26.

An advantage of this embodiment is that a simple and direct algorithm is used that enables fast modifications of the layout 10 and the structure 12, respectively, wherein the stretching and compressing of the first and second portion 18 and 26 is adjustable.

Figure 4:
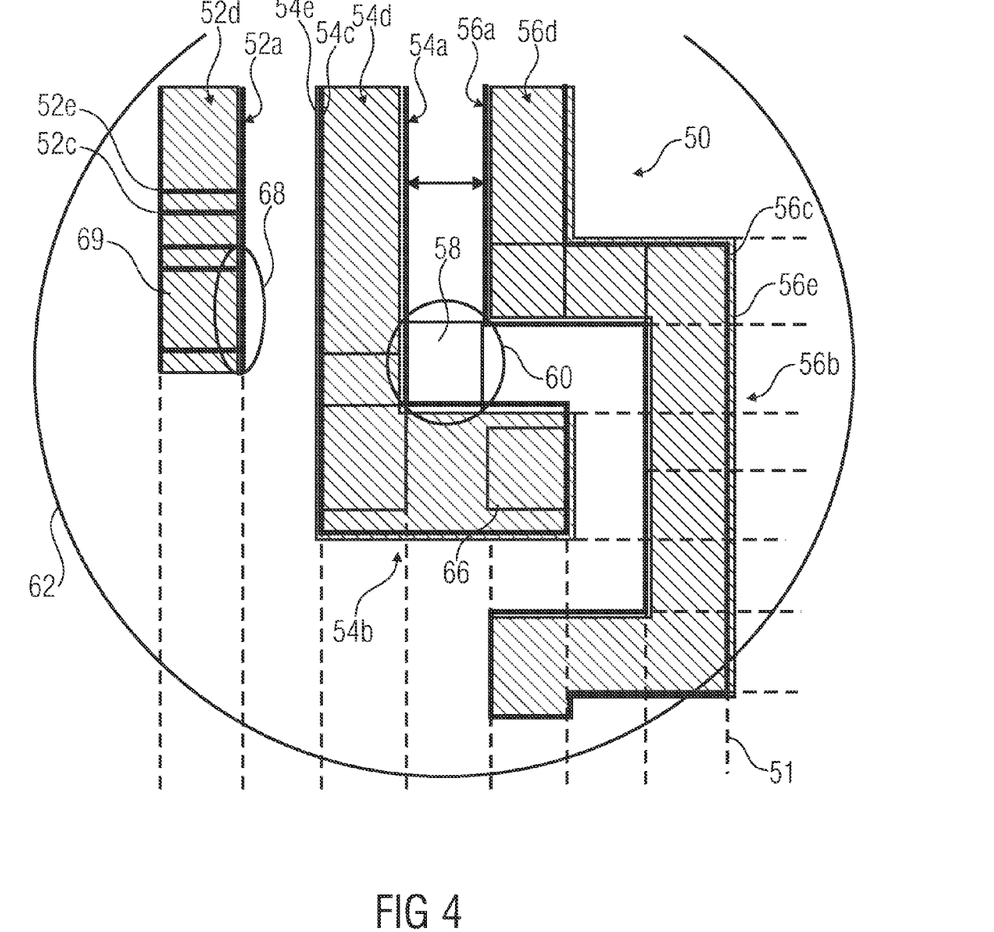
FIG. 4 shows a schematic section of a layout avoiding a hotspot on a substrate of a chip according to an embodiment.

FIG. 4 shows an embodiment of a layout which has been modified in order to avoid a hotspot. In particular, FIG. 4 illustrates, in non-hatched fashion and with dark lines, a section of an original layout 50 having three structure elements 52a, 54a and 56a registered with the predefined or original grid 51. The structure elements 52a, 54a and 56a are exemplarily shown to extend substantially along a first direction in parallel with a vertical axis of the grid 51 and are separated by spacings there between. The structure element 54a lies between the structure elements 52a and 56a and comprises an excursion region 54b which is orientated in a horizontal direction perpendicular to the first direction. The excursion region 54b is partly enclosed by a bulge region 56b of the structure element 56a which comprises a bulge in the second direction around the excursion region 54b. In the area between the excursion region 54b and the bulge region 56b some edges 54c and 56c of the respective structure elements 54a and 56a are close to each other such that the spacing there between is too small. The too small spacing causes a square shape hotspot 58 in the original layout 50. Furthermore, the structure element 54a comprises a via 66 at the excursion part 54b and the structure element 52a a via 64 within respective edges 52c of the structure element 52a.

In order to avoid the hotspot 58 in the area between the excursion region 54b and the bulge region 56b the grid in the inner region 60 (first portion of the layout 50) enclosing the square shape hotspot 58 by a circle is stretched. The grid in the outer transition region 62 (second portion of the layout 50) surrounding the inner region 60 is compressed such that the structure surrounding the outer transition region 62 is unmodified and, thus, registered with the predefined grid 51 of the original layout 50. In the inner region 60 and the outer transition region 62 structure elements 52d, 54d and 56d, marked by a hatching, are registered with the locally stretched and/or compressed grid. Thus, the structure elements 52d, 54d and 56d are stretched and/or compressed when compared to the respective structure elements 52a, 54a and 56a. Further, the original edges 52c, 54c and 56c are shifted to new edges marked as 52e, 54e and 56e and curved around the inner region 60.

The maximum shifting of the structure, in this embodiment, is small, e.g., about 5% for a stretching-factor S of 1.1. So, the via 66 of the structure element 54d is not significantly influenced by the stretching or compression and may be kept unchanged. But, vice versa, due to the shifting of the edge 52c to 52d, a via hole 68 at the via 64 is caused. If the via hole 68 does influence the function of the circuit, the via 68 may be moved by a noticeable fraction of the shifting, e.g., to the middle of the new and old position of the stretched and/or compressed grid (displacement by half of the shifting). If an overlapping of the vias to the first layer or further layers is not sufficient enough the further layers may be deformed and/or stretched and compressed, as will be described in the following.

In accordance with another embodiment, the layout defines a structure to be patterned onto a semiconductor based substrate comprising a plurality of layers. A hotspot at the first layer has been eliminated by stretching and compression of the predefined grid, as described above. A further layer also registered to the predefined grid, for example, in an upper or a lower layer, may be modified in order to provide a relaxation of the distortion of the structure at the first layer from the first layer to the further layer. Therefore, the grid of the further layer is stretched in a first region by half or a further percentage of the stretching of the inner region of the first layer and the grid of the further layer is compressed in a second area of the further layer by half or the further percentage of the compressing of the outer region of the first layer. The first area of the further layer and the inner region of the first layer have the same shape of its geometry and are aligned to each other. Analogously, the second area of the further layer complies regarding its shape with the outer transition region at the first layer and is aligned to the outer transition region. The sizes of the geometries of the first and second area of the further layer depend on the further percentage of the stretching and compressing of the same. The further percentage of the reduced stretching and reduced compressing may be set dependent on the number of layers such that the distortion may gradually be reduced from one layer to the next layer.

Figure 5:
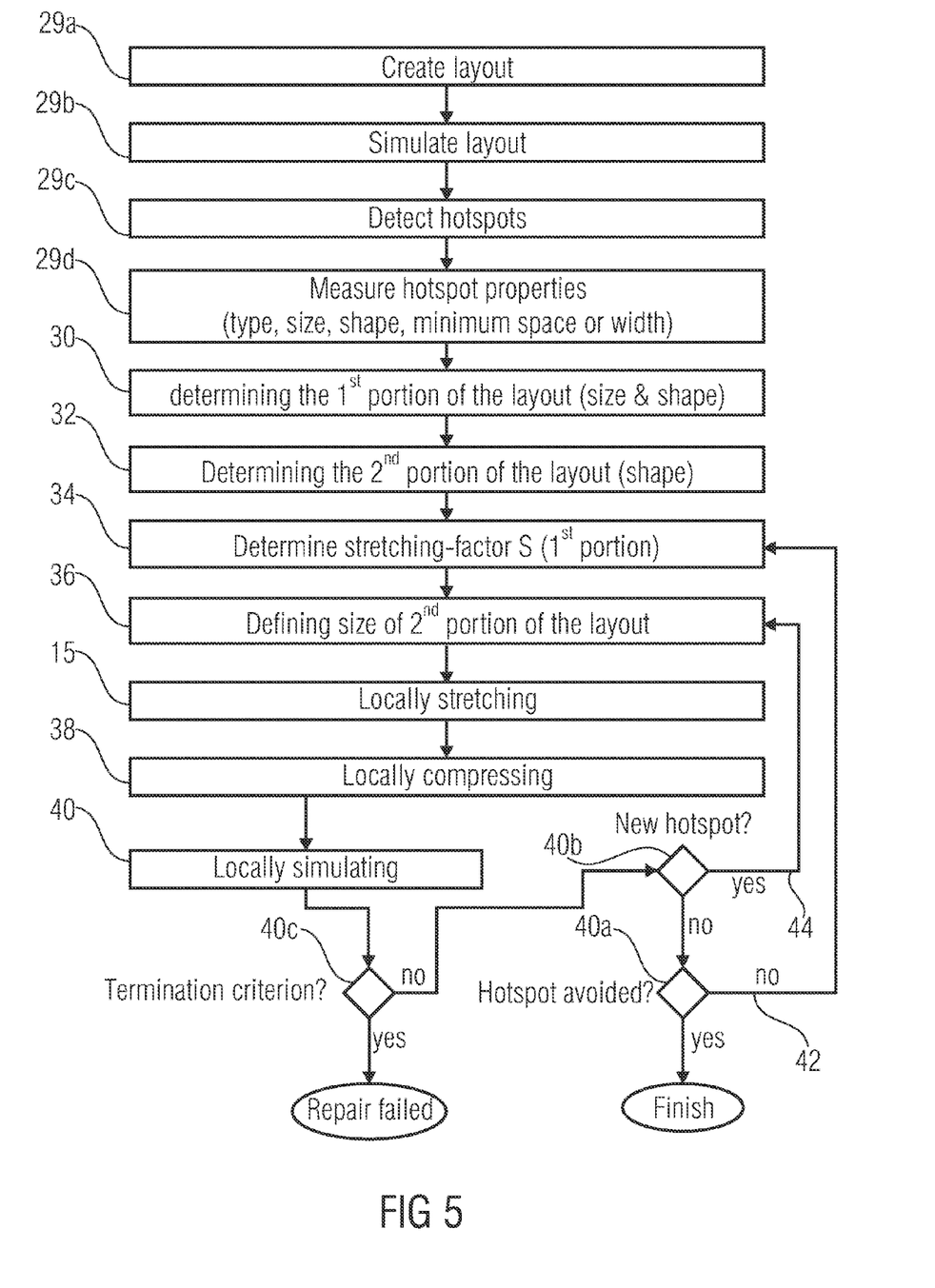
FIG. 5 shows a block diagram of a method for providing a layout according to an embodiment.

FIG. 5 shows a flow chart of a method according to an embodiment. The method comprises four preparation steps, namely, a preparation step 29a of creating the layout, a step 29b of simulating the layout, a step 29c of detecting hotspots and a step 29d of measuring the hotspot properties (including type, size, shape, minimum space or width). These four steps are performed as described above before the grid is modified according to the following steps. Step 30 of determining the size and the shape of the first portion, step 32 of determining the shape of the second portion, step 15 of locally stretching and step 38 of the locally compressing are performed as described above.

Further, the method comprises a step 40 of locally simulating the structure within the first and second portion after the steps 15 and 38. The step 40 includes three check steps, namely, a check step 40a for checking "if the detected hotspot is avoided" with a first reentry 42 to step 34 of determining the stretching-factor S, a check step 40b for checking "if a new hotspot is created" with a second reentry 44 to the step 36 of defining the size of the second portion and a check step 40c for checking "if a termination criterion is hit". In this embodiment, the two steps 34 and 36 are performed iteratively dependent on the steps 40a and 40b.

The step 40 of locally simulating comprises simulating a pattern of the layout in a first portion and a second portion for detecting whether a hotspot is still present or not and for detecting whether a new hotspot is caused in the second portion of the layout.

In particular, if the hotspot is still present the determined stretching-factor S may be increased, e.g., by 5% of the recent stretching-factor S, and the steps of locally stretching 15, locally simulating 40 and increasing the stretching-factor S may be repeated until the hotspot is no longer present. This corresponds to the reentry 42 from the check step 40a to the step 34 of determining the stretching-factor S. The reentry 42 to the step 34 of determining the stretching-factor S enables that a pessimistic value of the stretching-factor S may be determined or estimated in the step 34 for the first run of the method.

If the local simulation 40 detects the new hotspot caused by the compression of the second portion the size of the second portion may be enlarged and the steps of locally compressing 38, locally simulating 40 and enlarging the size of the second portion may be repeated until the new hotspot is no longer present. This also represents an iteration with the reentry 44 from the check step 40b to the step 36 of defining the size of the second portion. Thus, a pessimistic value of the size of the second portion may be determined or estimated in the step 36 for the first run of the method.

If the hotspot cannot be avoided or cannot be avoided without creating a new hotspot the method is terminated. Therefore, the check step 40c for checking "if the termination criterion is hit", e.g., ten iterations of the method or involvement of a second hotspot, has an exit of the method to "repair failed". The method is successfully finished if the detected hotspot is avoided and no new hotspot is generated.

Figure 6:
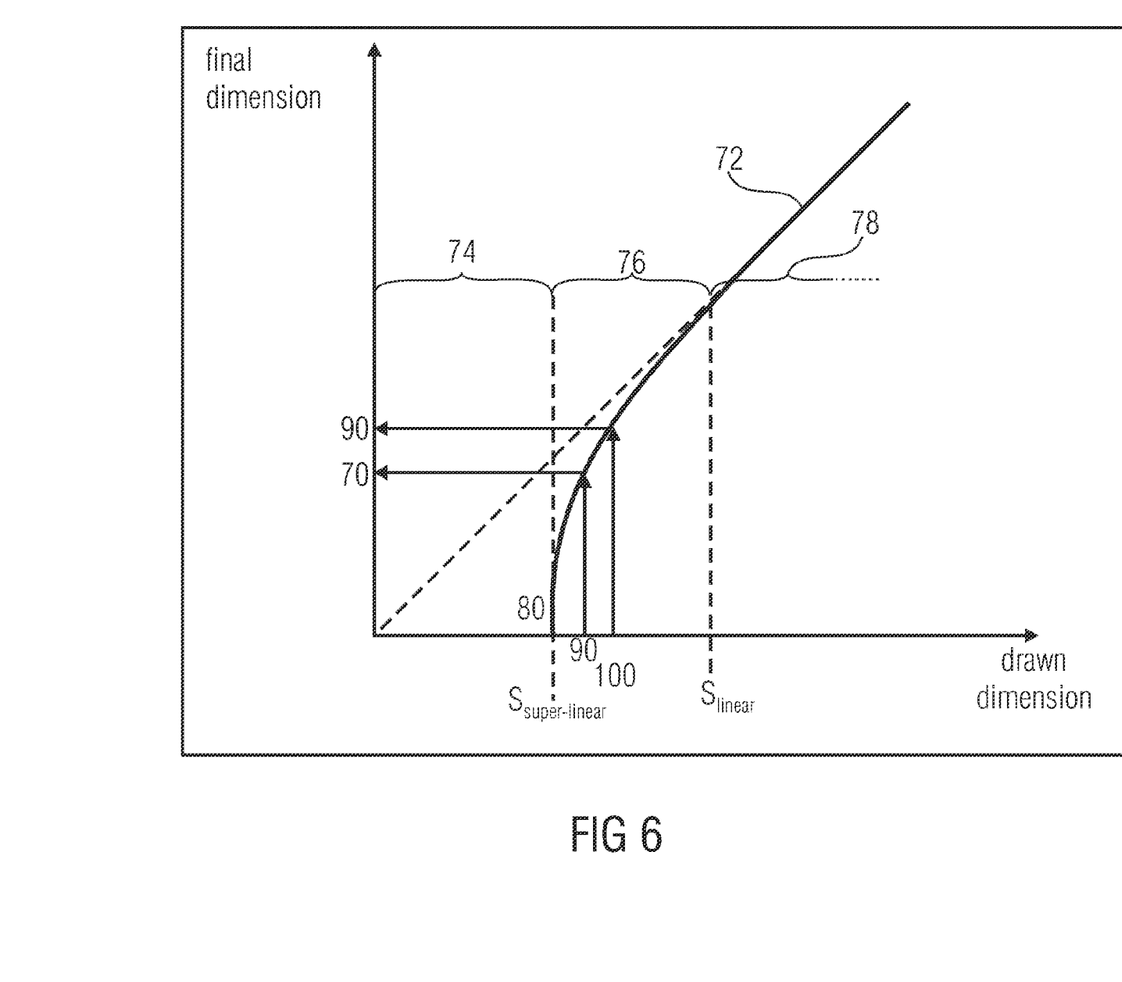
FIG. 6 shows a schematic diagram of the relationship between a drawn dimension and a final dimension of a layout.

FIG. 6 shows a schematic diagram for illustrating the relationship between the drawn dimension of the structure of the layout and the final dimension of the structure patterned on the substrate. The graph 72 has a first range 74 from zero to $S_{super-linear}$ (e.g., 80), a second range 76 from $S_{super-linear}$ to $S_{linear}$ (e.g., 130) and a third range 78 above $S_{linear}$.

In the range 78, the graph 72 shows a linear relationship of the drawn dimension and the final dimension, also referred to as printed dimension. That is, a value of the drawn dimension in this range 78 results in a value of the final dimension which is dependent on a selected scaling (gradient of the line through the origin) for patterning the structure on the substrate. In contrast, each value of the drawn dimension in the range 74 (e.g., below 80) results in a value of the final dimension causing a problematic spot on the substrate. The range 76 illustrates the super-linear behavior of the relationship between the drawn dimension and the final dimension. In this range 76 an increase of the drawn dimension results in an exponential increase of the final dimension. For example the drawn dimension, e.g., 90, results in the final dimension, e.g., 70, which is smaller than the hotspot-criterion $S_{hotspot-criterion}$, e.g., 80. In this case, the calculated stretching-factor S according to formula (1) has a value of 1.14, so the drawn dimension is stretched to 103. This drawn dimension results in the final dimension (approximately 90) which is way above the hotspot-criterion of 80. It follows that the stretching-factor S can be substantially smaller than the calculated value to remove the hotspot by minor modification of the structure. This super-linear behavior in the range 76 may be used for stretching the grid in the first portion, so that a reduced stretching-factor $S_{reduced}$ may be determined as follows:

$$S_{reduced} = S^k, (k<1) \qquad (2)$$

In the first run of the method a value of 0.5 for the factor k may be used, so that the step 15 of locally stretching may be performed in a first run of the method with a smaller stretching-factor $S_{reduced}$ (between 1 and the stretching-factor S) when compared to a pessimistic determination of the stretching-factor S. In most applications, the stretching in accordance with the reduced stretching-factor $S_{reduced}$ suffices. In the shown example, the reduced stretching-factor $S_{reduced}$ may be approximately 1.06 (for k=0.5). This results in a value of the drawn dimension of approximately 95 which is sufficient large to be patterned on the substrate. In accordance with the embodiment of FIG. 5, the reduced stretching-factor $S_{reduced}$ may be enlarged (or reduced) by varying the factor k if necessary. In terms of a minimum distortion of the structure, it is advantageous to set the stretching-factor $S_{reduced}$ smaller than theoretically calculated in accordance to formula (1) in the step 34 and to enlarge the stretching-factor $S_{reduced}$ if necessary. An alternative regarding the above embodiments is that the stretching-factor S is determined by another ratio of the minimum acceptable dimension ($S_{hotspot-criterion}$) and the minimum dimension ($S_{structure}$) of the structure at the hotspot.

The stretching of the grid complies, in the above embodiment, with a constant stretching as a function of the stretching-factor S. Alternatively, the stretching-factor S may be defined by a function which, for example, may depend on a coordinate of the hotspot. For example, the stretching the predefined grid and thus the stretching-factor S may decrease from the center of the first portion to the second portion.

A further alternative is that the compression of the predefined grid may decrease from the first portion to the third portion of the layout such that a transition region having an acceptable grid deformation may be built.

Another alternative is that complex geometries of the first and second portion are determined if the hotspot is of substantial complex shape or more than one adjacent hotspot are enclosed by the first and second geometries.

A further alternative regarding the first and second geometry of the first layer is to set the geometries of the first portion and the second portion of the layout and the stretching-factor S dependent on the further layout of further layers and vias, respectively. By using this method it is possible to find the optimum stretching, compressing and/or shifting for the layers of a chip or, in other words, the optimum complex distortion pattern for all layers.

Alternatively to a modified stretching and compressing of further layers, the further layers may be designed without relaxation so that the grid of the further layers is stretched and compressed in the same way as the first layer or, in other words, the same distortion may be used through the full layer stack and thus with no dislocation from one layer to the next layer.

Referring to FIG. 5, the step 40 of locally simulating may, alternatively, be performed such that the structure around the first and second portion may be locally simulated to be sure that modifications have no impact to the layout outside the first and second portion.

The predefined grid of the above described embodiments may comply with the grid used by the layout software for structuring the layout or may be set such that the structure of the layout may be deformed in accordance to the above described method. Thus, if a new grid is determined the layout is fractured according to the new grid before stretching and/or compressing the portions of the layout.

According to another embodiment, the above described method may be performed by an apparatus which comprises a modificator which is configured to stretch the grid locally in the first portion of the layout causing the hotspot on the substrate. The modificator may widen the width or spacing of the structure in the first portion.

According to a further embodiment, the method described above complies with a method for manufacturing a chip. The method comprises a first manufacturing step of providing the layout defining the structure on the substrate, wherein the structure is registered with the predefined grid of the layout. The grid is locally stretched in the first portion of the layout causing the hotspot on the substrate. A second manufacturing method step is patterning the substrate in accordance with the layout.

Although some aspects have been described in the context of a method, these aspects also correspond to a chip comprising a substrate which has a patterned region that is averagely registered with the predefined grid. The patterned region comprises a first portion in which the grid is stretched when compared to the predefined grid and a second portion in which the grid is compressed when compared to the predefined grid (see FIG. 3 lattice parameter $x_2 < x_0 < x_1$) so that a transition from the stretched grid to the predefined grid is generated. The substrate of the chip, onto which the structure according to the layout provided by the above described method has been patterned, has typically a maximum of 10% of a chip-area where the grid has been stretched and/or compressed. The portions having a stretched and/or compressed structure may be laterally distinct or locally distributed on the substrate. If a chip comprises a logical circuit and a non-logical circuit which is not registered to a grid the mentioned percentage of the stretched chip-area refers to an area of the logical circuit of the chip registered to the grid.

Although some aspects have been described in the context of a semiconductors, it is clear that this invention also relates to microelectronic devices, such as a board layout, a micromechanical device or a multi-chip package.

Furthermore, the described method is not limited to projection lithography. This method may also be applied to other pattern transfer methods, such as contact printing, direct e-beam writing or micro-engraving.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, such as, for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example, a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may, for example, be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may, for example, be configured to be transferred via a data communication connection, for example via the Internet.

A further embodiment comprises a processing means, for example, a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example, a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A method for providing a layout defining a structure to be patterned onto a substrate, the structure being registered with a predefined grid of the layout, the method being performed by a machine and comprising:
    locally stretching the grid in a first portion of the layout, the first portion causing a problematic spot on the substrate;
    locally compressing the grid in a second portion of the layout surrounding the first portion of the layout;
    determining a first geometry of the first portion of the layout, the first geometry comprising a size and a shape enclosing the problematic spot; and
    determining a second geometry of the second portion of the layout, the second geometry comprising a size and a shape enclosing the first geometry,
    wherein the first and second geometries comprise a circle if a hotspot is of substantially square-shape or an ellipse if the hotspot is of substantially elongated shape.

2. The method of claim 1, wherein the shape and the size of the first portion of the layout is set dependent on a shape and a size of the problematic spot indicating the problematic spot and/or dependent on a further problematic spot adjacent to the problematic spot.

3. The method of claim 1, wherein the layout causes a plurality of adjacent problematic spots on the substrate and wherein the first portion of the layout comprises a size and a shape to enclose the plurality of adjacent problematic spots.

4. The method of claim 1, wherein, in the second portion of the layout, the compression of the predefined grid decreases from the first portion of the layout to a third portion of the layout outside the second portion of the layout, the third portion of the layout comprising a non-compressed predefined grid.

5. The method of claim 1, wherein a further layout is provided for defining a further structure registered with the predefined grid and to be patterned in a different layer on the substrate, the method comprising:
    stretching the grid of the further layout in a first portion of the further layout; and
    compressing the grid of the further layout in a second portion of the further layout.

6. The method of claim 5, wherein the grid of the further layout is stretched in the first portion of the further layout by half of the stretching of the layout; and
    wherein the grid of the further layout is compressed in the second portion of the further layout by half of the compressing of the layout.

7. The method of claim 1, wherein the problematic spot comprises the hotspot.

8. A method for providing a layout defining a structure to be patterned onto a substrate, the structure being registered with a predefined grid, the method being performed by a machine and comprising:
    determining a size and a shape of a first portion of the layout around a location of the layout causing a problematic spot dependent on a shape and a size of a determined hotspot indicating the problematic spot;
    determining a second portion of the layout enclosing the first portion of the layout;
    determining a stretching-factor S for the first portion of the layout based on a deviation of a dimension of the structure at the hotspot from a minimum acceptable dimension of the structure;

defining a size of the second portion of the layout based on the size of the first portion of the layout or a maximum acceptable compression of the grid of the layout;

locally stretching the grid in the first portion of the layout in accordance with the stretching-factor S; and locally compressing the grid in the second portion of the layout.

9. The method of claim 8, further comprising:

simulating a pattern generated on the substrate by the layout having the stretched grid in the first portion of the layout and the compressed grid in the second portion of the layout for detecting whether the hotspot is still present and/or whether a new hotspot is caused by compressing the grid in the second portion of the layout;

increasing the stretching-factor S if the hotspot is still present;

enlarging the size of the second portion of the layout if the new hotspot is caused;

stretching the grid in the first portion of the layout in accordance with the increased Stretching-factor S; and compressing the grid in the enlarged second portion of the layout.

10. The method of claim 9, further comprising:

repeating the steps of simulating, increasing, enlarging, stretching and compressing until the hotspot is no longer present and no new hotspot occurred.

11. The method of claim 8, further comprising:

determining the hotspot in the structure caused by applying the layout for patterning the substrate.

12. A method for providing a layout defining a structure to be patterned onto a substrate, the structure being registered with a predefined grid of the layout, the method being performed by a machine and comprising:

simulating a pattern to be generated on the substrate by the layout for detecting a shape and a size of a hotspot in order and for characterizing a hotspot type;

determining a stretching-factor S for a first portion of the layout based on a deviation of a dimension of the simulated pattern at the hotspot from a minimum acceptable dimension of the simulated pattern; and locally stretching the grid in the first portion of the layout, the first portion causing a problematic spot on the substrate, wherein a shape and a size of the first portion of the layout is set dependent on a shape and a size of the problematic spot indicating the problematic spot and/or dependent on a further problematic spot adjacent to the problematic spot, and wherein locally stretching the grid in the first portion of the layout comprises applying the stretching-factor S to the first portion of the layout.

13. The method of claim 12, wherein the stretching-factor S is determined by a ratio of the minimum acceptable dimension and the dimension of the simulated pattern at the problematic spot.

14. The method of claim 12, wherein the stretching-factor S is determined by $$S = \frac{S_{hotspot-criterion}}{S_{structure}},$$

$(S_{structure} > 0)$ where:

S=stretching-factor S, $S_{hotspot-criterion}$ =minimum acceptable dimension of a simulated structure, and $S_{structure}$ =dimension of the simulated structure at the problematic spot.

15. The method of claim 14, further comprising:

simulating the pattern to be generated on the substrate by the first portion of the layout for detecting whether the problematic spot on the substrate is still present or not;

increasing the stretching-factor S by which the grid in the first portion of the layout had been stretched if the problematic spot is still present; and stretching the grid in the first portion of the layout using the increased stretching-factor S.

16. The method of claim 15 further comprising:

repeating the steps of simulating, increasing and stretching until the problematic spot is no longer present.

17. A non-transitory computer-readable medium comprising instructions, which, when executed by a computer, carry out a method to provide a layout defining a structure to be patterned onto a substrate, the structure being registered with a predefined grid of the layout, the method comprising:

locally stretching the grid in a first portion of the layout causing a problematic spot on the substrate;

locally compressing the grid in a second portion of the layout surrounding the first portion of the layout;

determining a first geometry of the first portion of the layout, the first geometry comprising a size and a shape enclosing the problematic spot; and determining a second geometry of the second portion of the layout, the second geometry comprising a size and a shape enclosing the first geometry, wherein the first and second geometries comprise a circle if a hotspot is of substantially square-shape or an ellipse if the hotspot is of substantially elongated shape.

18. A method for manufacturing a chip, the method comprising:

providing a layout defining a structure on a substrate, the structure being registered with a predefined grid of the layout, wherein the grid is locally stretched in a first portion of the layout causing a problematic spot on the substrate;

locally compressing the grid in a second portion of the layout surrounding the first portion of the layout;

determining a first geometry of the first portion of the layout, the first geometry comprising a size and a shape enclosing the problematic spot; and determining a second geometry of the second portion of the layout, the second geometry comprising a size and a shape enclosing the first geometry, wherein the first and second geometries comprise a circle if a hotspot is of substantially square-shape or an ellipse if the hotspot is of substantially elongated shape; and patterning the substrate in accordance with the layout.

19. A method for providing a layout defining a structure to be patterned onto a substrate, the structure being registered with a predefined grid of the layout, the method being performed by a machine and comprising:

locally stretching the grid in a first portion of the layout causing a problematic spot on the substrate;

locally compressing the grid in a second portion of the layout surrounding the first portion of the layout;

simulating a pattern generated on the substrate by the second portion of the layout for detecting whether a new hotspot is caused in the second portion of the layout;

enlarging the second portion if the new hotspot is caused; and repeating the steps of simulating, enlarging and compressing the grid in the enlarged second portion of the layout until the new hotspot is no longer present.

* * * * *